United States Patent [19]

Hara et al.

[11] Patent Number: 4,625,227
[45] Date of Patent: Nov. 25, 1986

[54] RESIN MOLDED TYPE SEMICONDUCTOR DEVICE HAVING A CONDUCTOR FILM

[75] Inventors: Yuji Hara, Koganei; Satoru Ito; Tatsuro Toya, both of Tokyo, all of Japan

[73] Assignees: Hitachi, Ltd; Hitachi Microcomputer Engineering, Ltd., both of Tokyo, Japan

[21] Appl. No.: 744,151

[22] Filed: Jun. 13, 1985

Related U.S. Application Data

[63] Continuation of Ser. No. 292,585, Aug. 13, 1981, abandoned.

[30] Foreign Application Priority Data

Sep. 1, 1980 [JP] Japan .................. 55-119817

[51] Int. Cl.⁴ .............. H01L 23/48; H01L 27/02; H01L 29/34; H01L 29/40
[52] U.S. Cl. .................. 357/68; 357/40; 357/52; 357/53; 357/65; 357/72
[58] Field of Search .............. 357/26, 65, 68, 73, 357/52, 54, 53, 40, 45, 72

[56] References Cited

U.S. PATENT DOCUMENTS 3,906,539 9/1975 Sauermann et al. .............. 357/53
4,453,174 6/1984 Kawasaki et al. .............. 357/26

FOREIGN PATENT DOCUMENTS 52-75993 6/1977 Japan .............. 357/26

Primary Examiner—J. Carroll
Attorney, Agent, or Firm—Antonelli, Terry & Wands

[57] ABSTRACT

A resin molded type semiconductor device has a metallic guard ring that is formed to cover the peripheral edge of the surface of a tetragonal semiconductor substrate. In order to prevent a passivation film on the guard ring from being cracked by stresses due to a resin mold package concentrating in the four corners of the semiconductor substrate, slits or rows of small holes are formed in the corner portions of the guard ring.

33 Claims, 16 Drawing Figures

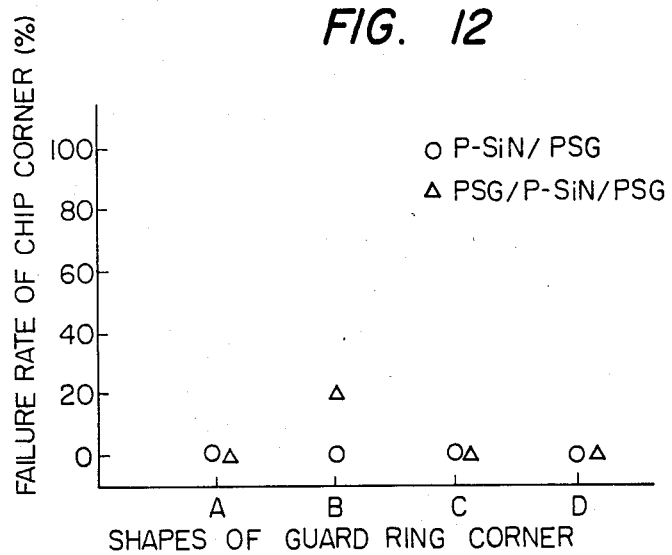
FIG. 12
FIG. 13A
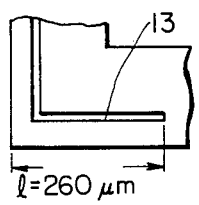
FIG. 13B
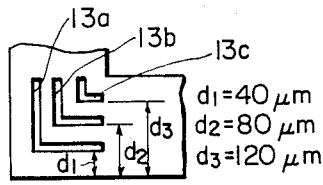
FIG. 13C
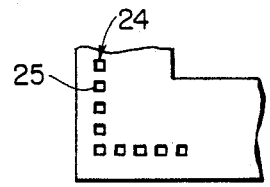
FIG. 13D
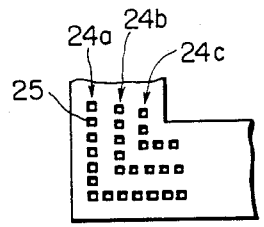

RESIN MOLDED TYPE SEMICONDUCTOR DEVICE HAVING A CONDUCTOR FILM

This is a continuation of application Ser. No. 292,585, filed Aug. 13, 1981, abandoned.

This invention relates to a resin molded type semiconductor device, and more particularly to a ring structure which is formed on a semiconductor substrate.

It has been well known that an insulating film is formed on the surface of the peripheral edge of a silicon semiconductor substrate (chip) formed with one or more circuit elements, and that a conductive ring is disposed on the insulating film in a manner to extend along the peripheral edge of the semiconductor substrate. Such structure is disclosed in, for example, West German Patent Laid Open Print (Offenlegungsschrift) 30 02 740. The ring is used for preventing an inversion layer in the semiconductor substrate surface on which the insulating film is formed. It can also be used as wiring for applying the ground potential (reference potential) or power source potential of a circuit.

In order to reduce the manufacturing cost of a discrete semiconductor device or a semiconductor integrated circuit device, it is proposed to use a resin mold package instead of a ceramic package or glass package as a sealing structure for the device. To the end of the reduction of the manufacturing cost, accordingly, the semiconductor substrate having the aforecited ring structure is also requested to be sealed in the resin mold package.

The inventors' experiments and research, however, have revealed that in case where the semiconductor substrate having the ring structure is molded with a resin by the well-known transfer mold technique, high stresses ascribable to the molding resin act especially on the four corners of a tetragonal semiconductor substrate (chip), resulting in cracks in a passivation film which overlies the ring at the corners of the chip and the semiconductor substrate near the corners. The cracks give rise to non-conforming articles of the semiconductor device, or form a cause for degradations in the characteristics of the semiconductor device. By way of example, the inventors studied the problem on a large-scale integrated circuit device (LSI) shown in FIGS. 1 and 2. In a chip 100, in FIGS. 1 and 2, semiconductor element regions 2, constituting active regions are formed in one major surface of a silicon semiconductor substrate 1. On an insulating film 3, overlying the surface of the peripheral edge of the substrate, wirings 4, and bonding pads 5, which are made of an aluminum film are formed and are surrounded with a conductor ring 6. The ring 6, is connected to the substrate 1 (ground line). A passivation film (final passivation film) 7, of phosphosilicate glass (PSG) or silicon nitride is formed on the surface of the chip in a manner to expose the pad portions 5. It has been revealed that, in case where the chip 100, is molded with a resin, high stresses attributed to the molding resin act especially on the four corners of the peripheral edge of the chip, so the passivation film 7, cracks on and around the ring 6.

The semiconductor device of such structure was subjected to a moisture-resistance test in a high-temperature and high-humidity atmosphere. As a result, the following defects have been revealed. In case of using a PSG (phosphorus oxide-containing silicate glass) film as the inter-layer insulating film which underlies the aluminum wiring, moisture invades the device through the cracks having appeared in the final passivation film. Thus, phosphorus in the PSG film liquates out and corrodes the aluminum wiring overlying this PSG film. The corrosion of the aluminum wiring reaches the active region of the chip, resulting in the occurrence of a defective unit of the chip or degradations of the characteristics thereof.

It is, accordingly, an object of this invention to improve the inferior characteristics and enhance the moisture resistance of a resin molded type semiconductor device having a guard ring.

As the result of experiments and research, the inventors have found out that such defects as cracks in the passivation film existing on and around the ring at the corner parts of the chip, as heretofore described, are dependent on the effective width of the ring. The reason therefor is considered as follows. When the chip is molded with the resin by the transfer mold technique, the temperature of the molding resin material is lowered from a high temperature to a normal room temperature, or when the finished semiconductor product in the resin mold package is operated, the chip generates heat, so that the corner parts of the chip undergo high stresses on account of the expansion and shrinkage of the molding resin. The stresses displace or expand and shrink the ring of aluminum. Due to the displacements of the aluminum ring, cracks appear in the final passivation film or the passivation film underlying the ring. It is, accordingly, considered that, in order to reduce the stresses which the aluminum ring at the corner parts exerts on the passivation films nearby, the effective width of the ring at the chip corner parts should be made small, i.e., the exposed area of the ring is reduced.

The present invention has been made with these findings in mind.

According to one aspect of this invention, a metallic conductor ring formed along the peripheral edge of one major surface of a tetragonal semiconductor substrate is provided with slits or a plurality of arrayed holes, at the corner parts of the substrate in order to reduce selectively the exposed area of the ring and thereby reduce the effective width of the ring.

Hereunder, this invention will be described with reference to the drawings.

FIG. 12 is a graph showing the relationships between the shape of a conductor ring and the failure rate of chip corners, in semiconductor devices according to other embodiments of this invention; and FIGS. 13A–13D are schematic plan views showing various shapes of conductor rings at corner parts in order to explain the graph of FIG. 12.

Figure 1:
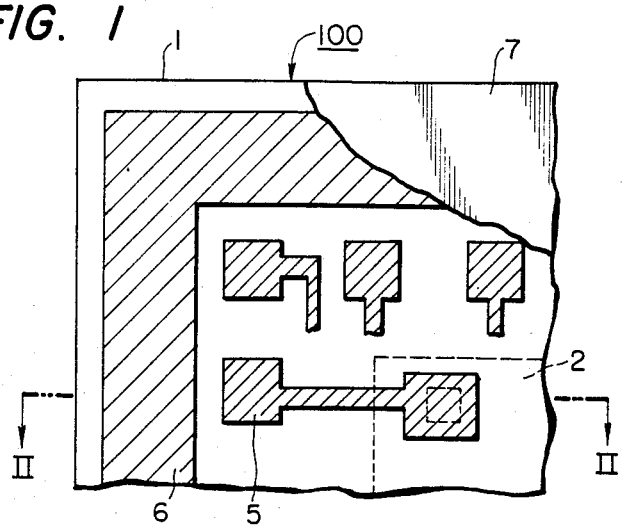
FIG. 1 is a plan view of a semiconductor device having a prior art conductor ring configuration as was used in the experimental researches of this invention.
Figure 2:
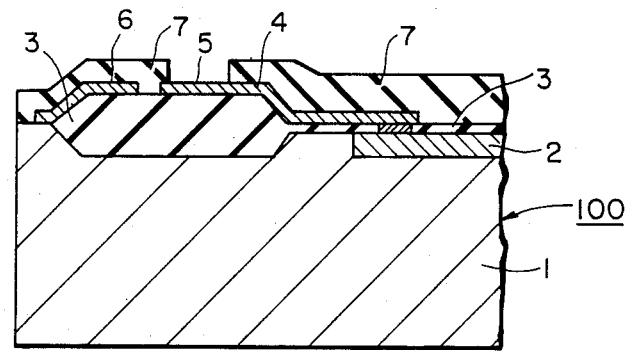
FIG. 2 is a sectional view of the semiconductor device of FIG. 1 taken along line II—II indicated in FIG. 1.
Figure 3:
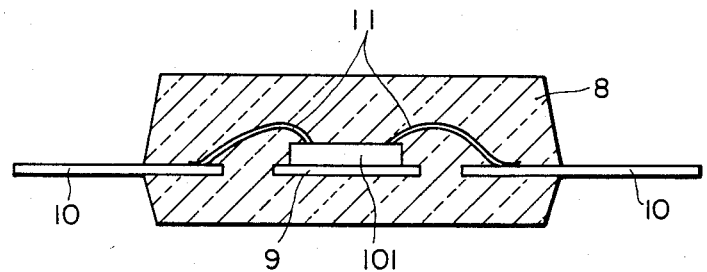
FIG. 3 is a sectional view showing the finished body of a semiconductor device according to this invention.

FIGS. 3–6 are views illustrating a preferred embodiment of this invention. FIG. 3 shows a semiconductor device including a resin mold package fabricated in accordance with this invention. In the figure, numeral 8 designates a sealing member of a resin formed by the well-known transfer mold technique. The resinous sealing member 8, seals a tetragonal silicon chip 101, a metallic lead 9, having a holding portion to which the chip 101, is fastened, parts of a plurality of metallic external leads 10, and connector wires 11, electrically connected between the chip 101, and the respective external leads 10. The resin member may be formed of thermosetting resin such as epoxy resin or thermoplastic resin.

Figure 4:
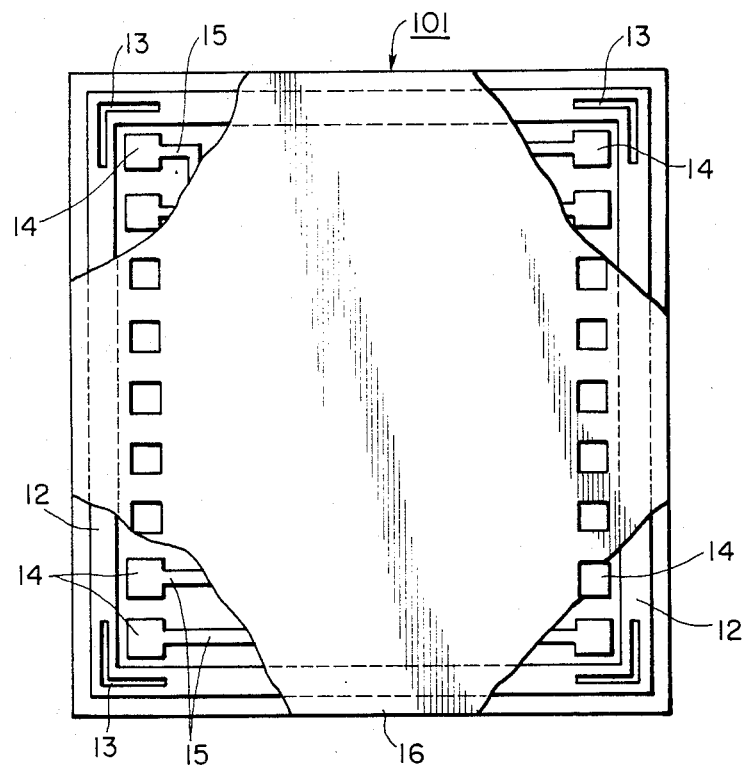
FIG. 4 is a fragmentary plan view showing the chip of the semiconductor device of FIG. 3.

FIG. 4 shows a plan view of the chip 101. The chip 101, is made of a semiconductor substrate of single-crystal silicon, in which active regions of circuit elements such as source regions and drain regions are formed by the well-known impurity diffusion technique. This embodiment illustrates the caes of a MOS IC (Metal-Oxide-Semiconductor Integrated Circuit) where logic circuits constructed of MOS FETs are formed in the shape of an integrated circuit. In FIG. 4, numeral 12 designates a conductive ring of aluminum which is formed on an insulating film on the silicon semiconductor substrate. The ring 12 is used as ground wiring for the logic circuits. The outside terminating part of the ring 12, is electrically connected with the silicon semiconductor substrate. The four corner parts of the ring 12, are, respectively, formed with L-shaped slits 13, in accordance with this invention. The slits 13, will be described in detail later. Bonding pads 14, for bonding the wire connectors 11, (FIG. 3) are formed along the inner sides of the ring 12. Wirings or wire leads 15 extend from the respective bonding pads 14, to the active regions. The wirings 15, are covered with a final passivation film 16. The final passivation film 16, has openings for exposing the bonding areas of the bonding pads 14. The connector wires 11, are connected to the bonding areas.

Figure 5:
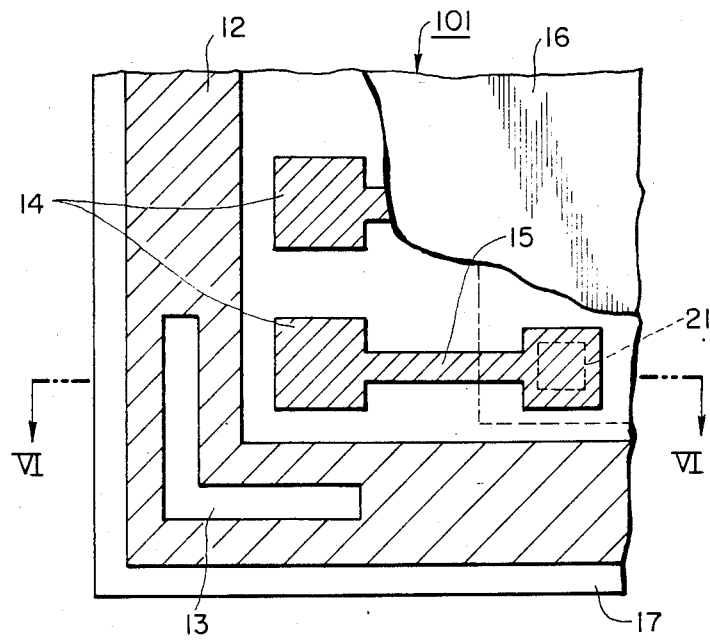
FIG. 5 is an enlarged partial plan view of the chip shown in FIG. 4.
Figure 6:
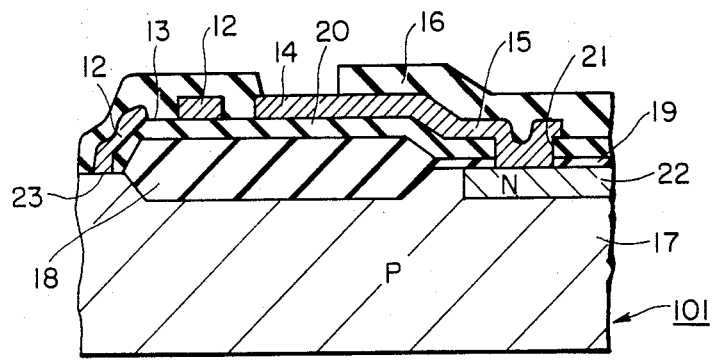
FIG. 6 is a sectional view of the semiconductor device of FIG. 5 taken along line VI—VI indicated in FIG. 5.

FIG. 5 is an enlarged partial view of the chip 101, shown in FIG. 4. Also, FIG. 6 is a sectional view taken along line VI—VI of FIG. 5. The chip 101, includes a thick silicon-oxide (SiO$_2$) film (field insulating film) 18, which is formed on one major surface of the silicon semiconductor substrate 17, and a thin silicon-oxide (SiO$_2$) film 19, which covers the regions forming the circuit elements. The technique of forming a thick oxide film on selected parts of a single silicon semiconductor substrate, except on regions used to form elements thereon, is well known from, for example, *Philips Research Reports*, Vol. 26, No. 3, pp. 157–165, June 1971. The embodiment is the MOS IC of the so-called LOCOS (Local Oxidation of Silicon) type described in the literature. The thin oxide film 19, formed on the element regions is used as the gate oxide films of the MOS FETs consititing the MOS IC. Although not shown in the drawings, gate electrodes of polycrystalline silicon are formed directly on parts of the thin oxide film 19, thereby to forming the MOS FETs. A phosphosilicate glass (PSG) (phosphorus oxide-containing silicate glass) film 20, is formed in a manner to cover the silicon gate electrodes and those parts of the field oxide film 18, and the thin oxide film 19, on which the silicon gate electrodes are not formed. The PSG film 20, serves as a getter for impurities such as sodium ions entering from the exterior, and is necessary for stabilizing the eelctrical characteristics of the surface of the silicon semiconductor substrate of the semiconductor device. On the PSG film 20, there are formed the foregoing conductor ring 12, bonding pads 14, and wirings 15, all of which are made of aluminum. These can be simultaneously formed in such a way that a film of aluminum having a thickness of 1 μm is formed on the entire surface of the chip by the well-known evaporation technique and that the film is patterned by the etching technique. The aluminum wirings 15, lie in ohmic contact with semiconductor regions 22, being some of the element regions, via through-holes 21, formed in the PSG film 20, and the SiO$_2$ film 19. The aluminum conductor ring 12, lies in ohmic contact with the silicon semiconductor substrate 17, at its outer terminating part 23. Thus, the potential of the conductor ring 12, is made identical to that of the substrate 17. Since, in the embodiment, the conductor ring is especially used as the ground line of the circuitry, the ohmic contact part 23, forms a current path for supplying current to the lead 9, (FIG. 3) which is connected to the rear major surface of the semiconductor substrate 17. In the corner parts of the conductor ring corresponding to the corners of the chip, the L-shaped slits 13, are formed along the corners and centrally of the conductor ring. The final passivation film 16, is made up of one layer among a PSG film, a silicon oxide (SiO$_2$) film formed by the well-known CVD (Chemical Vapor Deposition) process and a silicon nitride film formed by the well-known plasma process (hereinbelow, simply terms the "P-SiN film"), or a multilayer structure consisting of at least two of the films. Examples of the present embodiment adopted for the final passivation are of two sorts, i.e., a two-layer structure which consisted of a PSG film as a first layer (lower layer) and a P-SiN layer formed thereon, and a three-layer structure which consisted of a PSG film as a first layer, a P-SiN film as an intermediate layer and a PSG film as a third layer.

In the examples, the size of the chip was 4.7 mm×4.7 mm. The width of the conductor ring was made to be at least 100 μm in order to prevent the increase of the resistance of the aluminum film as a wiring connection while the width of the slit was set at approximately 10 μm in order to prevent the increase of the resistance of the guard ring at the corner part.

According to such structure, the conductor ring is provided with the slits, and hence, the occurrence of the cracks in the passivation film can be prevented for the following reason.

Figure 7:
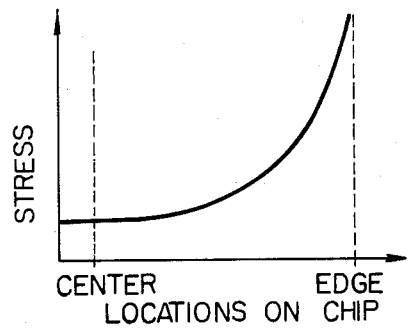
FIG. 7 is a graph showing the distribution state of stresses which arise in a chip plane due to a molding resin.

Regarding the fact that the conductor ring on the peripheral part of the resin-molded semiconductor chip causes the cracks, etc., of the passivation film, stresses which tend to concentrate in the edge of the chip more than the center thereof as shown in FIG. 7, especially in the corners of the tetragonal chip. On the other hand, it has been experimentally confirmed that the tendency is more pronounced as the effective width of the aluminum film of the conductor ring is greater. It has also been confirmed by various experiments that when the slits are formed at the corner parts of the conductor ring, the effective width of the conductor ring decreases by the width of the slits, whereby the stresses at the corner parts are reduced, with the result that the cause for the occurrence of the cracks is eliminated.

With the structure described above, accordingly, the displacements of the aluminum conductor ring at the corner parts to be induced by the molding resin are reduced owing to the slits, and the reduced displacements do not exert high stresses on the passivation films which lie in contact with the aluminum film and which are less displaced than the metal. Therefore, the passivation films are not cracked.

Further, it has been confirmed that the occurrence of the cracks can be prevented independent of any thickness of the guard ring in the range from about 0.8 $\mu$m to about 4 $\mu$m.

Figure 8:
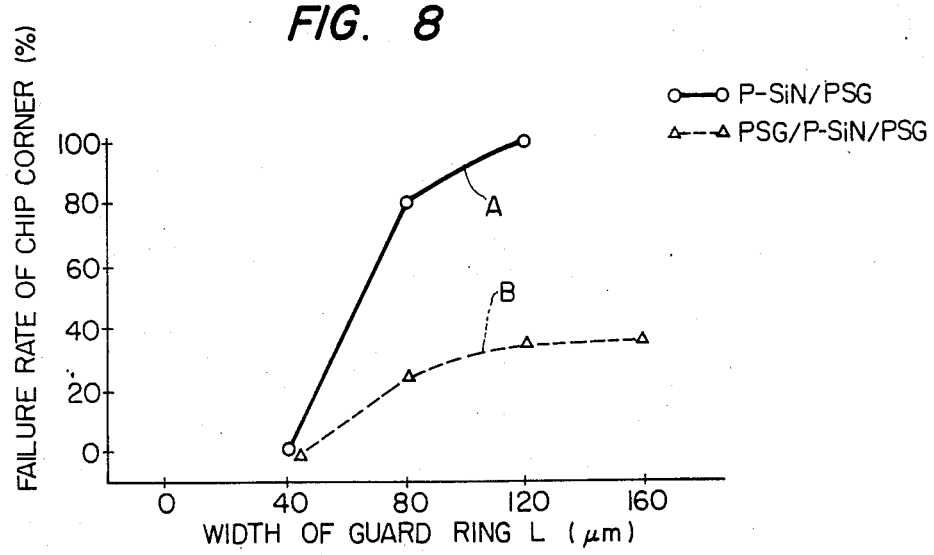
FIG. 8 is a graph showing the relationships between the effective width (or exposed area) of an aluminum ring and cracks which appear at the corner parts of a passivation film.
Figure 9:
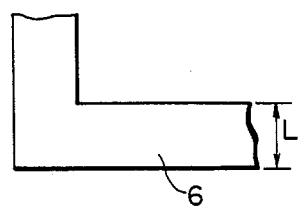
FIG. 9 is a schematic plan view showing the shape of a guard ring at a corner part in order to explain the graph of FIG. 8.

In order to facilitate understanding of the effect of this invention, the relationship between the rate of occurrence of the cracks of the passivation film and the width L of the conductor ring was experimentally found by employing the shape of the prior art conductor ring of aluminum as shown in FIG. 9. FIG. 8 illustrates this relationship, in which the percentage of samples having undergone the cracks is taken on the axis of ordinates as the failure rate of chip corners and the width L (FIG. 9) of the conductor ring is taken on the axis of abscissa. In this case, the chip size was 4.7 mm×4.7 mm. As the final passivation films, the two sorts of the three-layer structure of PSG/P-SiN/PSG and the two-layer structure of P-SiN/PSG were used. The thicknesses of the passivation films were PSG/P-SiN/PSG=0.85 $\mu$m/1.1 $\mu$m/0.2 $\mu$m and P-SiN/PSG=1.1 $\mu$m/0.2 $\mu$m. As temperature cycles, a temperature change of from −55° C. to +150° C. was repeated 20 times. Thus, the stresses to occur the expansion and shrinkage of the resin package based on the temperature changes were acceleratedly applied to the chip corners. In FIG. 8, a curve A corresponds to the passivation film of P-SiN/PSG, while a curve B corresponds to the passivation film of PSG/P-SiN/PSG.

As understood from FIG. 8, the failure rate is smaller as the width L of the conductor ring is smaller. That is, the stresses to be exerted from the resinous sealing member on the chip are higher as the effective width of the conductor ring is greater.

Figure 11:
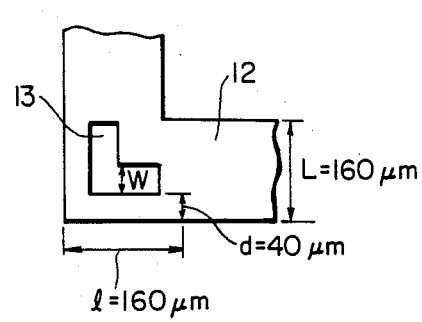
FIG. 11 is a schematic plan view showing the shape of a conductor ring at a corner part in order to explain the graph of FIG. 10.
Figure 10:
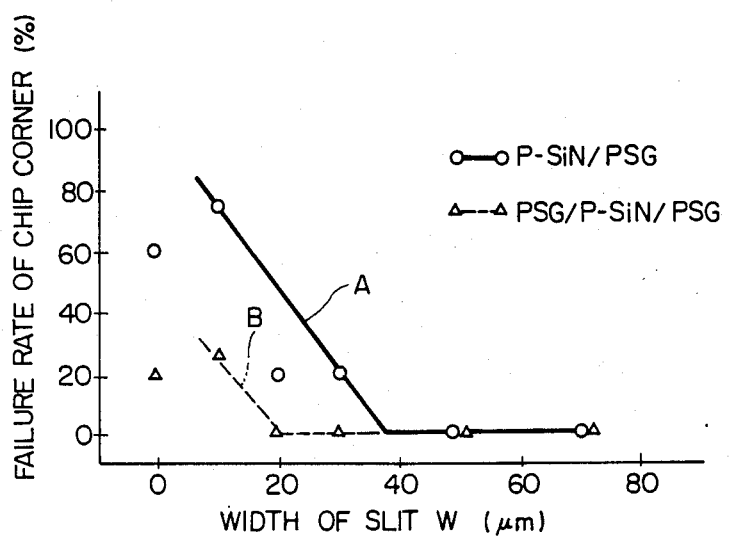
FIG. 10 is a graph showing the relationships between the width of a slit in a conductor ring and the failure rate of chip corners, in semiconductor devices embodying this invention.

FIG. 10 is a graph illustrating the fact that the percentage of the occurrence of the cracks of the passivation film corresponding to the conductor ring portion in the case of forming the L-shaped slits according to this invention in the corner parts of the conductor ring, as shown in FIG. 11, depends upon the width W of the slits. As the passivation films in this case, a curve A corrsponds to the two-layer film of P-SiN/PSG=1.1 $\mu$m/0.2 $\mu$m, and a curve B the three-layer film of PSG/P-SiN/PSGW=0.85 $\mu$m/1.1 $\mu$m/0.2 $\mu$m. As understood from FIG. 10, the failure rate of chip corners lowers remarkably at slit widths of 20 $\mu$m–40 $\mu$m. The conditions of the chip size and the temperature cycles in this case were the same as in the case illustrated in FIG. 8.

FIGS. 13A–13D show further embodiments of this invention. While the figures schematically illustrate various shapes of the corner part of the aluminum conductor ring 160 $\mu$m wide in a semiconductor device, the remaining construction of the semiconductor device is the same as explained with reference to FIGS. 3–6.

The embodiment shown in FIG. 13A corresponds to a case where one elongated slit is formed so that its length l from the corner of the conductor ring may be 260 $\mu$m.

FIG. 13B illustrates a case where three short slits, 13a, 13b and 13c, are juxtaposed to one another.

FIG. 13C illustrates a case where small square holes 25, are arrayed in the L-letter shape 24. This embodiment is more advantageous than the case of forming the L-shaped slit in that the increase of the resistance at the corner part of the conductor ring can be prevented.

FIG. 13D illustrates a case where small holes 25, are arrayed into three L-shaped rows 24a, 24b and 24c. The size of the hole 25, in this case is made, for example, 10 $\mu$m square.

As to the embodiments of FIGS. 13A–13D, the rates of occurrence of the cracks of the final passivation films at the corner parts were studied. The results are shown in FIG. 12. The semiconductor pellets in this case were 4.7×4.7 mm square, and the temperature cycles were temperature changes of from −55° C. to +150° C. repeated 20 times. Likewise to the case of FIG. 10, the passivation films were of the two-layer structure of P-SiN/PSG and the three-layer structure of PSG/P-SiN/PSG. In FIG. 12, marks O correspond to the cases of employing the passivation films of P-SiN/PSG, and marks Δ the case of employing the passivation films of PSG/P-SiN/PSG.

As understood from FIGS. 12, the failure rates of the chip corners can be lowered by forming the slits and the rows of the holes As apparent from the foregoing embodiments, according to this invention, means for reducing the effective width of the conductor ring at the corner part, such as the slit and the row of the holes, is added to the corner part of the ring. Thus, the stress which the molding resin exerts on the passivation films adjoining the guard ring at the corner part can be reduced, so that the passivation films can be prevented from cracking.

This invention is not restricted to only the foregoing embodiments. By way of example, the construction and shape of the passivation film to be formed on the conductor ring of aluminum can be properly modified. The shape of the ring itself is sometimes modified depending upon the arrangement of the internal circuits or the bonding pads. The resinous sealing member may well include an undercoating resin which is directly applied on the surface of the conductive ring portion. While aluminum has been referred to as the material of the conductive ring, a different metal film such as molybdenum silicide film may well be used.

Further, this invention is effective for enhancing the moisture resistance when applied to semiconductor devices which have a conductive ring and which employ a passivation film lying in contact with wirings and containing a high concentration of phosphorus, especially semiconductor devices such as plastics molded type LSIs.

What is claimed is:

1. A semiconductor integrated circuit device having element regions which are formed in one major surface of a substantially tetragonal semiconductor substrate, a broad conductor film which provides a power source wiring and which is formed on an insulating film on the major surface of the semiconductor substrate and arranged to extend along a peripheral part of the major surface and on at least one corner of said semiconductor substrate, an inorganic passivation film which is formed over said conductor film, and a sealing member of a resin which overlies said passivation film and molds the semiconductor substrate; said broad conductor film having at least one opening therein for substantially limiting the effective width at a portion of the conductor film located on said at least one corner of said semiconductor substrate and for reducing stresses caused by the sealing member overlying the conductor film at said at least one corner thereby eliminating the occurrence of cracks in said passivation film; said at least one opening having a width that is substantially smaller than the width of said broad conductor film provided by portions of the broad conductor film adjacent to said at least one opening and the width of said broad conductor film being sufficient to act as a power wiring for said element regions.

2. A semiconductor device according to claim 1, wherein said conductor film is covered with a passivation film of phosphosilicate glass.

3. A semiconductor device according to claim 1, wherein said conductor film is electrically connected with said semiconductor substrate at an outer terminating part of the conductor film.

4. A semiconductor device according to claim 1, wherein said at least one opening is an L-shaped slit.

5. A semiconductor device according to claim 1, wherein said at least one opening comprises a plurality of holes arrayed into an L-letter shape.

6. A semiconductor device according to claim 1, wherein said conductor film is made of aluminum.

7. A semiconductor integrated circuit device comprising:
a holding member;
a substantially tetragonal semiconductor substrate having opposite major surfaces and fixed on said holding member at one of said major surfaces, said semiconductor substrate having an elongated broad conductor film which provides a power source wiring and which is formed on an insulating film on the other of said major surfaces and arranged to extend along the periphery of said substantially tetragonal semiconductor substrate, said elongated broad conductor film having at least one opening therein for substantially limiting the effective width of a portion of the film located on at least one of the four corners of said substantially tetragonal semiconductor substrate; said at least one opening having a width that is substantially smaller than the width of said broad conductor film provided by portions of the broad conductor film adjacent to said at least one opening and the width of said broad conductor film being sufficient to act as a power wiring for element regions formed in the other of said major surfaces;
an inorganic passivation film formed over said conductor film and said other of said major surfaces of said semiconductor substrate;
a molding member of a resin covering said holding member, said semiconductor substrate, said conductor film and said passivation film;
a plurality of leads, each having one end portion which extends to the vicinity of a peripheral edge of said holding member inside said molding member and the other end portion which protrudes out of said molding member, said one end portions of said plurality of leads being electrically connected to electrodes on said semiconductor substrate.

8. A semiconductor device according to claim 7, wherein said at least one opening formed in the portion of the conductor film located on at least one corner of said substantially tetragonal semiconductor substrate is a slit.

9. A semiconductor device according to claim 8, wherein said slit is L-shaped.

10. A semiconductor device according to claim 7, wherein said at least one opening formed in the portion of the film located on at least one corner of said substantially tetragonal semiconductor substrate comprises a plurality of arrayed holes.

11. A semiconductor device according to claim 10, wherein said plurality holes are arrayed into an L-letter shape.

12. A semiconductor device according to claim 7, wherein said elongated broad conductor film is electrically connected with said semiconductor substrate.

13. A semiconductor device according to claim 7, wherein said elongated broad conductor film is covered with a film of phosphosilicate glass.

14. A semiconductor device according to claim 7, wherein said elongated broad conductor film is made of aluminum.

15. A semiconductor device according to claim 7, wherein the width of said broad conductor film is 100 $\mu$m.

16. A semiconductor device according to claim 15, wherein the width of said opening is approximately 10 $\mu$m.

17. A semiconductor integrated circuit device comprising:
a semiconductor substrate having one major surface thereon;
a plurality of element regions formed in said one major surface;
a narrow conductor film formed over one portion of the major surface of the semiconductor substrate;
a broad conductor film formed over another portion of the major surface of the semiconductor substrate including a peripheral part of said major surface;
an inorganic passivation film formed over the narrow conductor film and the broad conductor film;
a sealing member comprised of a resin which covers the passivation film and molds at least the major surface of the semiconductor substrate;
the broad conductor film including at least one opening within a portion of the conductor film overlying a peripheral portion of said semiconductor substrate to which relatively strong stress is applied by said sealing member whereby cracks which occur in said passivation film, in absence of said at least one opening are avoided; said at least one opening having a width that is substantially smaller than the width of said broad conductor film provided by portions of the broad conductor film adjacent to said at least one opening and said width of the broad conductor being sufficient to act as a power wiring for said element regions.

18. A semiconductor integrated circuit device according to claim 17, wherein the at least one opening comprises a slit.

19. A semiconductor integrated circuit device according to claim 17, wherein the at least one opening includes a plurality of holes that are formed through said conductor film.

20. A semiconductor integrated circuit device according to claim 1, wherein said sealing member is formed of a thermosetting or thermoplastic resin and the substrate is a silicon chip.

21. A semiconductor integrated circuit device according to claim 20, wherein said broad conductor film is made of aluminum.

22. A semiconductor integrated circuit device according to claim 20, wherein said broad conductor film is made of a metal and said passivation film is made of a glass.

23. A semiconductor integrated circuit device comprising:
(a) a holding member;
(b) a substantially tetragonal semiconductor substrate having a first major surface and a second major surface, and secured on said holding member at the second major surface, said semiconductor substrate having a plurality of narrow conductor films and a broad conductor film formed substantially simultaneously over the first major surface extending along peripheral edge of said semiconductor substrate;
(c) a plurality of element regions formed in said first major surface;
(d) an inorganic passivation film formed over the narrow conductor films the broad conductor film and the element regions;
(e) a sealing member of a resin covering said holding member, said semiconductor substrate, said narrow conductor films, said broad conductor film and said passivation film;
(f) a plurality of leads, each having one end portion which extends to the vicinity of a peripheral edge of said holding member inside said sealing member, and the other end portion which protrudes out of said sealing member, said one end portions of said plurality of leads being electrically connected to electrodes at the first major surface of said semiconductor substrate;
said broad conductor film having at least one opening therein for substantially limiting the effective width at a portion of the broad conductor film overlying a portion of the semiconductor substrate to which stress is applied by said sealing member; said at least one opening having a width that is substantially smaller than the width of said broad conductor film provided by portions of the broad conductor film adjacent to said at least one opening and the width of said broad conductor film being sufficient to act as a power wiring for said element regions.

24. A semiconductor integrated circuit device according to claim 23, wherein the at least one opening comprises a slit.

25. A semiconductor integrated circuit device according to claim 23, wherein the at least one opening includes a plurality of holes that are formed through said broad conductor film.

26. A semiconductor integrated circuit device according to claim 23, wherein said narrow and broad conductor films are composed of metal material mechanically softer than that of said passivation film.

27. A semiconductor integrated circuit device having a plurality of element regions which are formed in one major surface of a substantially tetragonal semiconductor chip, and metal wiring means for electrically connecting said plurality of element regions formed on the major surface of the semiconductor chip; said metal wiring means comprising a broad metal conductor film formed adjacent to the peripheral edge of the semiconductor chip, an inorganic passivation film which is formed over said broad metal conductor film and a thermosetting sealing resin which overlies said passivation film and which encapsulates the semiconductor chip, said broad metal conductor film having at least one opening for substantially limiting the effective width at a portion of the semiconductor chip at which stress is applied by said sealing resin, said at least one opening having a width that is substantially smaller than the width of said broad conductor film provided by portions of the broad conductor film adjacent to said at least one opening and the width of said broad conductor film being sufficient to act as a power wiring for the plurality of element regions.

28. A semiconductor device according to claim 27, wherein said broad conductive film is covered with a passivation film comprised of phosphosilicate glass.

29. A semiconductor device according to claim 27, wherein said at least one opening comprises a slit.

30. A semiconductor device according to claim 27, wherein said at least one opening comprises a plurality of holes.

31. A semiconductor device according to claim 27, wherein said broad conductor film comprises aluminum.

32. A semiconductor integrated circuit device according to claim 1, wherein said power source wiring is a wiring for applying a ground potential to said element regions.

33. A semiconductor integrated circuit device according to claim 2, wherein said power source wiring is a wiring for applying a power source potential to said element regions.

* * * * *